United States Patent [19]

Yamazaki et al.

[11] 3,878,549

[45] Apr. 15, 1975

[54] SEMICONDUCTOR MEMORIES

[76] Inventors: Shumpei Yamazaki; Yuriko Sugimura, both of c/o Yamazaki Kogyo Kabushiki Kaisha, 9-7 1-chome Shinkawa, Shizuoka, Japan

[22] Filed: Sept. 11, 1973

[21] Appl. No.: 396,223

Related U.S. Application Data

[63] Continuation-in-part of Ser. No. 187,273, Oct. 7, 1971.

[30] Foreign Application Priority Data

Oct. 27, 1970 Japan .............................. 45-094482
Mar. 30, 1971 Japan .............................. 46-018959

[52] U.S. Cl. ...................... 357/23; 357/54; 357/41; 357/42

[51] Int. Cl. ........................................... H01l 21/14

[58] Field of Search ........ 317/235 B, 235 R, 235 G; 357/54, 23, 24, 41, 42

[56] References Cited

UNITED STATES PATENTS 3,649,884 3/1972 Haneta ............................ 317/235 R

*Primary Examiner*—Martin H. Edlow
*Attorney, Agent, or Firm*—Holman & Stern

[57] ABSTRACT

A metal insulator-silicon field effect transistor is disclosed having an MNCNOS gate structure displaying semiconductor memory characteristics. The gate structure disclosed comprises at least one semiconductor layer comprising a plurality of clusters of a semiconductor material disposed over a first nitride insulating layer.

9 Claims, 28 Drawing Figures

Transmission Electron Microscope
of
Si* Clusters

No cluster deposition
T=700℃
$t_{SiN}$ 1100Å

Si* cluster deposition
$SiH_4$ 10sec for cluster
$t_{SiN}$ 1100Å
T=700℃

Si* cluster deposition
$SiH_4$ 30sec for cluster
$t_{SiN}$ 1100Å
T=700℃

1μm

SEMICONDUCTOR MEMORIES

This is a Continuation-in-Part application of U.S. Patent application Ser. No. 187,273, filed Oct. 7, 1971.

BACKGROUND OF THE INVENTION

In conventional semiconductors having a MNOS structure it has been considered that the trap center which is utilized is formed accidentally owing to variations in processing.

The applicant established that the hysteresis phenomena to be found in the capacitance vs. gate-voltage characteristics of the MIS structure and as the MNS and MNOS structures arises because of the clusters or the thin-film existing in the insulator coating and acting as a trap center for electrons and holes in addition to the so-called irregularity of the atomic size lattice defect that was believed to cause the trap center and interface charge effect.

SUMMARY OF THE INVENTION

The present invention relates to a structure of an insulator coating to be used for a semiconductor memory device in a Metal-Insulator-Silicon Field Effect Transistor.

The present invention is to provide on the surface of a semiconductor, clusters or the thin-films, both made of a semiconductor, while keeping a constant distance between them.

The present invention relates in particular to the structure and the fabrication of a semiconductor memory device and the novel mechanism of the trap center.

DETAILED DESCRIPTION OF PREFERRED EMBODIMENTS OF THE INVENTION

Figure 1:
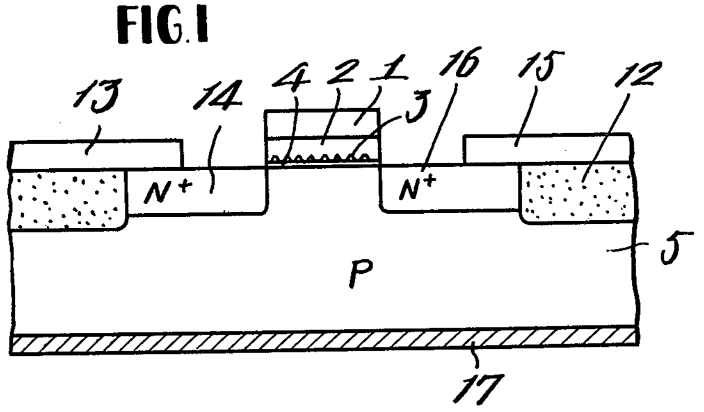
FIG. 1 shows generally the cross-section of a MISFET of the present inventive structure.

The present invention relates to the structure of an insulator coating to be used for a semiconductor memory device. More specifically, the invention is to provide a layer or layers comprising clusters of a semiconductor material or thin-film layers on specified boundaries or near to them with insulated coating in two or more layers to be formed on a semiconductor substrate, thereby to control the charge to be accumulated on the clusters or the thin-film layers in its presence, polarity and quantity, and in this manner to control the current flowing through the semiconductor under the coatings.

Heretofore, the MASFET (Metal-Alumina-Silicon Field Effect Transistor) and the MNOSFET (metal-Nitride-Oxide-Silicon FET)known as semiconductor devices which feature the use of trap centers existing in their insulator coatings. These trap centers in MAS or MNOS have been considered as a product of inequality in atomic size due to unexpected variation in processing.

Accordingly, it is hard to control the captured carriers of electrons or holes since it is difficult to determine the extent of the trap center and its distance from the interface. However, according to the present invention, the metal or semiconductor clusters are distributed uniformly in the insulator, such that they act as the trap centers for the captured carriers together with additional trap centers provided by the atomic size irregularity existing in the vicinity of the clusters.

Accordingly, when a cluster-free or cluster-less insulating coating is produced, the coating has very little or no trap centers. When the clusters or thin-film of semiconductor are sandwiched in the cluster-free or cluster-less insulating coatings, it is possible to determine the extent of the trap center and its distance from the interface thereby providing the possibility of the control of the trapped carriers.

The present invention provides on the surface of semiconductor with the clusters or the thin-film while keeping a constant distance from the semiconductor surface.

The present invention also relates to the structure of the insulator coating where the clusters or the thin-film is to be surrounded by insulated film. Because the clusters function as a leak current path for DC, it is not desirable to distribute the clusters in the direction of the thickness of the coatings. Whether the clusters trap the carriers of electrons or holes is influenced by the distance from the interface to the clusters. With irregular spacing such as a narrow spacing at a specific point, charges are trapped in an irregular manner and the energy band of the semiconductor substrate near the interface is deformed, the characteristic of the current existing near the interface of the semiconductor substrate deteriorates. In other words, if it is required to control the current in the semiconductor substrate by changing polarity and quantity of the charge trapped in the trap centers, the charge should be distributed uniformly with a constant density keeping the distance constant from the interface. This was proved through an experiment relating to the present invention which is directed to the structure and fabrication required of the mechanism of the trap centers.

In the following discussion, insulated film or insulated coating means one layer of the insulator and insulator coating means generically multiple layered insulated coatings, semiconduuctor cluster and semiconductor thin-film.

In FIG. 1, a cross-section of MISFET utilizing the present invented construction is shown. It should be noted that any semiconductor device such as FET, self-align silicon gate MISFET, conventional MISFET, DSAMISFET, etc., can be used to act as a sensor simply utilizing the present invention. In other words, when the present invention is utilized for RAM (RANDOM ACCESS MEMORY), the above semiconductor device senses the information memorized in the insulator coating. However, when the present invention is applied to vary the thrheshold voltage (*Vth*) relative to operating voltages of the semiconductor device, the semiconductor device of the present invention will play a secondary role.

In FIG. 1, the present invention is utilized to fabricate the gate of the MISFET. A MIS construction consists of metal or doped silicon or germanium 1, insulated coatings 2, 4, clusters or thin-film of semiconductor 3, semiconductor substrate 5 of P type silicon in this case and bottom electrode 17. The current in the semiconductor device flows through lead 13, source 14, channel that lies under the gate, drain 16 and lead 15 of the drain.

Silicon-oxide 12 is used to isolate the leads and the substrate thereby reducing stray capacitance between them.

In FIG. 2, an embodiment of the present invention is shown structurally. FIGS. 2B, 2D, 2F and 2H illustrate conductor electrode 1, insulated coatings 2, 4, 6, 8, 11 and semiconductor clusters or thin-films 3, 7.

For the conductor electrode, P or N type impurities made of one-side doped or both both-side doped multi-crystal silicon or germanium are used besides metal such as aluminum, gold, titanium, platinum, etc. The clusters shown in the FIGS. 2(A), 2(C), 2(E), 2(G), 2(I), 2)J), 2(K), 2(L) have a hemispherical shape and are made of silicon or germanium similar to said thin-films. An electron micrograph reveals the configuration of the clusters in squeezed shape as well as hemispherical ranging from tens of angstroms to 3000 angstroms in diameter. The area with oblique lines, such as in FIGS. 2(B), 2(D), 2(F), 2(H), 2(I) and 2(J) indicates the semiconductor thin-film. Due to the difficulty in measurement, the exact thickness of the thin-film is hard to measure accurately, but, however, it is believed that the thickness is in the range of 5 to 300 angstroms on an average.

The insulated coating 2 contacting closely with semiconductor clusters or thin-film must be unaffected by high temperatures during heat annealing and for this reason either silicon nitride, silicon oxi-nitride, germanium nitride, silicon oxide, aluminum oxide, tantalum oxide or titanium oxide has been used for the coating material. Depending on the application, a combination of these materials may also be selected. In general, an oxide material generates oxygen gas when it is annealed and the gas reacts on the cluster or thin-film squeezing the shape thereof. For this reason, silicon nitride is used mostly. Care should be taken to exclude clustering of silicon or germanium substantially from the coating 2.

In the FIGS. 2(A), 2(B), 2(E), 2(F), 2(G), 2(H), 2(I), 2(J) and 2(K), a mono-layer of the insulator coating made of silicon oxide or silicon nitride or germanium nitride is used under the semiconductor clustr or the thin-film. In the FIGS. 2(C) and 2(D), multi-layers consisting of coatings (4) and (11) are used.

In the case of a silicon semiconductor substrate, a silicon oxide coating of less than 200 angstroms in thickness, typically between 10 angstroms and 50 angstroms, with insulated coating of silicon nitride or germanium nitride of less than 200 angstroms in thickness, typically between 10 angstroms and 50 angstroms, on it is selected. In general, a silicon semiconductor yields silicon oxide easily on its surface and this makes the surface stable. However, as silicon oxide reacts on the semiconductor cluster or the thin-film during the annealing stage, the insulating characteristic, boundary characteristic, etc., become consequently inferior. To deal with these difficulties, a heat-proof nitride film 4 is formed on the surface of silicon oxide and then the semiconductor cluster or the thin-film is formed on the nitride film.

Figure 2A:
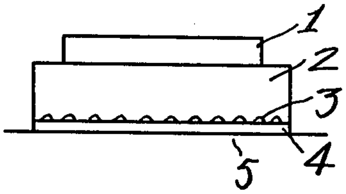
FIGS. 2A–2L show different embodiments.
Figure 2G:
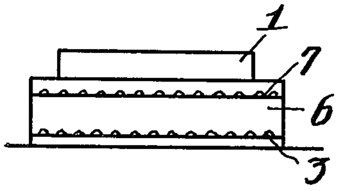
Figure 2B:
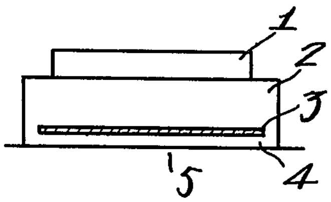
Figure 2H:
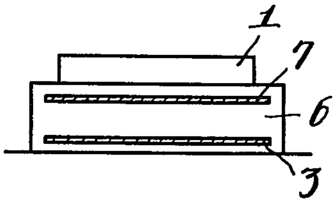
Figure 2C:
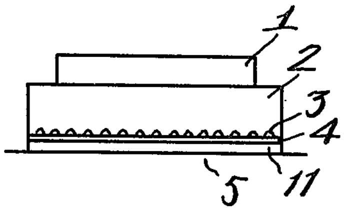
Figure 2I:
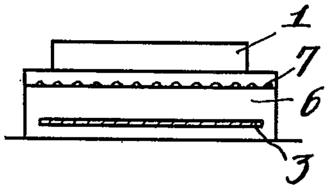
Figure 2D:
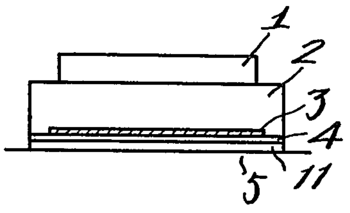
Figure 2J:
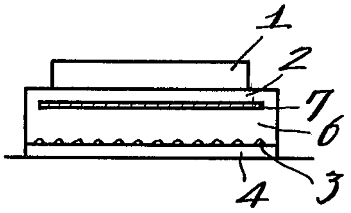
Figure 2E:
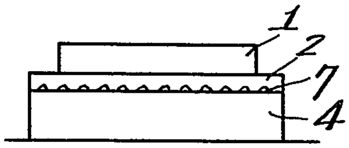
Figure 2K:
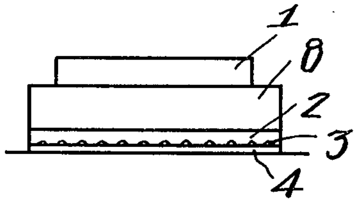
Figure 2F:
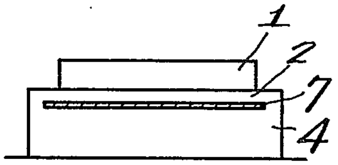
Figure 2L:
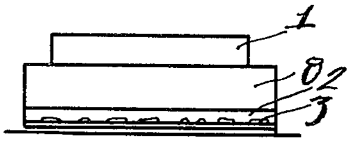

In the FIGS. 2(K) and 2(L), the insulator coating consists of nitride coating 2 and other insulated coatings such as of silicon oxide, doped silicon oxide or coating that has a higher specific dielectric constant, such as tantalum oxide or titanium oxide. The nitride coating is formed on the latter making the insulator coating monolythic. The thickness of the insulator coating ranges from 300 to 3000 angstroms, confirming to the present processing technique.

As described above, and as shown in FIG. 2, the basic structure of the present inventive insulator coating consists of a triple-layered cluster stacking to be fabricated as in the following steps or forming the insulator coating 2 on the semiconductor clusters or thin-film 3 to be formed on mono-layer insulated coating 4 as in FIG. 2B, or multi-layered insulated coatings 4 and 11. The coatings are to be formed on the semiconductor substrate 5 thinly. Two layers of insulated coating are shown in the figure, but, however, the number of coating-layers can be increased.

Either metal or semiconductor can be used as material for the cluster or the thin-film; however, semiconductors such as silicon and germanium have been used in the experiment because a metal would shift the C-V characteristic (capacitance vs. gate voltage) in a positive direction as unreversed, whereas a semiconductor has reversible hysteresis characteristics.

In the embodiment, the clusters or thin-film of silicon are processed by chemical vapor deposition (CVD) with silane, vacuum evaporation or silicon sputtering and the cluster or thin-film of germanium is processed by vacuum evaporation or pyrolisis of germane. In the case of cluster production by the vacuum evaporation, it was found by experiment that surfaces to be formed as the clusters should be kept at lower temperature without preheat, at about 300°C. Also, the use of CVD with silane was easy in the experimental process compared to the use of reactive gas such as of $Si_2Cl_2$, $SiHCl_3$, $SiCl_4$, etc. If a tribasic or pentabasic impurity such as boron or phosphorous to be used for semiconductor substrate is doped with these reactive gases, thereby providing the clusters or thin-film with P or N type conduction, the level in the energy band for the cluster can be changed. In addition to this, metal and semiconductor mixture can be used for the cluster or the thin-film.

Figure 3A:
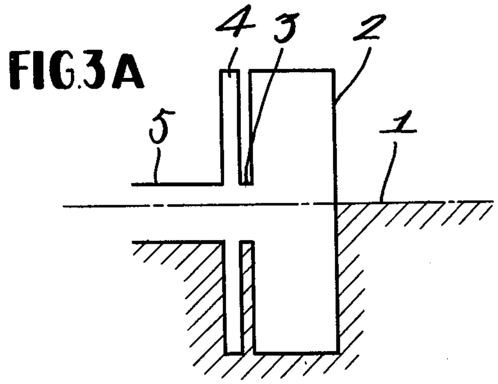
FIGS. 3(A) and 3(B) are energy band structures which are intended to correspond to the FIGS. 2(A), 2(B) and 2(C), 2(D), respectively.

FIG. 3 depicts energy bands shown in the FIGS. 2(A) through 2(D). The FIG. 3 3(A) consists of aluminum gate metal 1, silicon nitride 2, clusters or thin-film of silicon 3 and silicon nitride 4 with semiconductor substrate 5, and thus has structure of MNCNS (Metal-Nitride-Cluster-Nitride-Substrate). It should be noted that the silicon clusters are formed to capture electrons or holes and thus function as trap centers and the layer of silicon clusters has the same band configuration as the semiconductor substrate. For this reason, the present invention does not use conventional atomic size trap centers that take more than one microsecond of time normally for injection and recombination of the carriers transmitted thereto, but uses elements resulting from the existence of the cluster and the thin-film. In this way, the present invention differs completely from the conventional MNOS structure in technical concept.

Figure 3B:
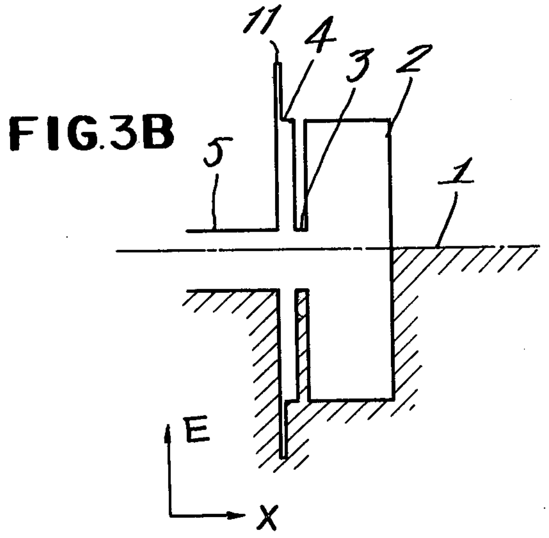

FIG. 3(B) corresponding to the FIGS. 2(C) and 2(D) consists of aluminum metal gate 1, silicon nitride 2, clusters or thin-film of silicon 3, silicon nitride 4 and silicon semiconductor substrate 5, and thus has structure of MNCNOS. THe materials indicated here were used in the experiment and they are only by way of example.

The material of the semiconductor substrate may be germanium, gallium arsenide, etc., instead of silicon. Though the band structure will not be the same, the material for 2, 4 may be of silicon nitride or germanium nitride and for 3 germanium and for 1 doped silicon or germanium.

Embodiment 1

The embodiment 1 relates to the FIGS. 2(A) and 2(B). The following discussion will reveal the details of fabrication for the MNCIS structure and its result.

Silicon, germanium, gallium arsenide, etc. is used for the semiconductor substrate; however, silicon semiconductor having $No = 1 \times 10^{15}cm^{-3}(100)$ of crystallographic axis in its impurity density has been used in this experiment. After the semiconductor substrate is cleaned, the insulated coatings 2 and 4 are formed using solid vapor reaction deposition and CVD. In the former processing, the substrate was placed in either dry oxygen or wet oxygen, both at the temperature of 500° to 1,100°C for thermal oxidation. A time of 5 seconds to one minute was required for thermal oxidation at 900° to 1,100°C.

In the latter processing, the substrate was placed in either nitrogen or ammonia at 1,000° to 1,350°C so that a silicon nitride coating was formed thereon. A thickness of coating of less than 100 angstroms was obtained at 1,150° to 1,200°C in a time interval of 10 minutes to an hour.

Silicon oxide coating having the thickness of less than 200 angstroms was produced by chemical reaction between silane of $0.1^{cc}$ per minute and oxygen of 10 to $500^{cc}$ per minute with carrier gas of nitrogen of 5l/min. at 200° to 500°C.

Silicon nitride coating was produced to react either silane or $SiH_2Cl_2$ or $SiHCl_3$ or $SiCl_4$ on ammonia or hydrazine at 500° to 900°C. The detailed data is as follows:

| | |
|---|---|
| Silane or $SiH_2Cl_2$ | $0.2 - 0.4^{cc}$/min. |
| Ammonia | $100 - 300^{cc}$/min. |
| Carrier gas of nitrogen | 2.5 l/min for silicide<br>0.5 l/min for ammonia |
| Furnace | Vertical reaction furnace with catalyst of reduced nickel oxide for activation of ammonia |

The resulting silicon nitride coating included either no cluster or a negligible amount of cluster. Adding less than 100 ppm of oxygen or nitric oxide to the reactive gas obtained in the above process, silicon oxi-nitride was produced.

Germanium nitride was produced reacting $GeH_4$ or $GeCl_4$ on ammonia at 400° to 700°C. Germane of 0.2° – $0.4^{cc}$/min. were used while keeping the temperature of the substrate at 550°C in the experiment. Other data remained the same as in the processing of the silicon nitride coating.

The CVD utilizing silane or germanium was effective processing for the clusters or the thin-film, however, the use of $SiH_2Cl_2$ made the processing easier. In the latter, carrier gas of hydrogen of 0.5 l/min. for ammonia and nitrogen of 2.5 l/min. for $SiH_2Cl_2$ were used. Halogenide of silicon or germanium, such as silicon tetrachloride or germanium tetrachloride or trichloride silane, can be used in the processing, however, silane and germane were chosen because they can be handled more easily. With these gases of silicon or germanium, ammonia or hydrazine both of less volume of gas than the former can be used to augment the cluster depositing. Besides, vacuum evaporation or sputtering may be employed; however, these will require separate stations to produce the element 3 from the station where the silicon nitride coating process shall be done. For this reason, the surface of the cluster or the thin-film will get dirty and oxidized.

Figure 4:
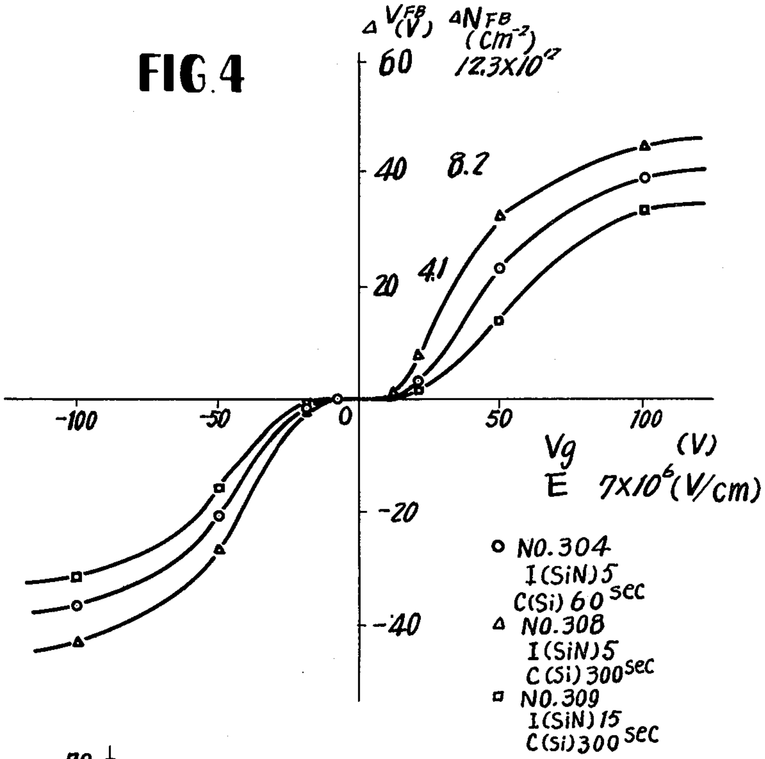
FIGS. 4 and 5 show the data derived from the experiment in a MNCNS structure.

FIG. 4 shows the result obtained from the MNCNS structure utilizing the silicon nitride coating for the 2 and 4 by the CVD processing.

The total thickness of the coating was 1,250 angstroms. FIG. 4 is based on general C-V characteristic of the MNCNS structure such as the FIG. 6.

In FIG. 4, the $x$ axis represents gate voltage or potential of the field and the $y$ axis represents the degree of hysteresis in the form of $\Delta V_{FB}$ (for the voltage change at flat band) or $\Delta N_{FB}$ (for the charge density change captured by the cluster or the thin-film at flat band).

The experiments in No. 304 and No. 308 show that as C(3) increases its thickness in appearance, the hysteresis increases merely.

The experiments in No. 308 and No. 309 show that as the insulating coating 4 increases, the hysteresis decreases. Consequently, making the insulating coating 4 smaller and C(3) larger will increase the charge density to be captured. However, making the coating 4 too thin will cause the charge captured to interfere the current through the semiconductor or weaken the retentiveness of the charge being captured.

The data shown in the FIG. 4 indicates $\Delta N_{FB} = \mathbf{8.2 \times 10^{12}}cm^{-2}$ and the value is larger by about five times compared to the conventional MNOS structure having hysteresis by chance, that is, $\Delta N_{FB} = \mathbf{1 \sim 2 \times 10^{12}}cm^{-2}$ Thus, the present invention has unequalled novelty.

Figure 5:
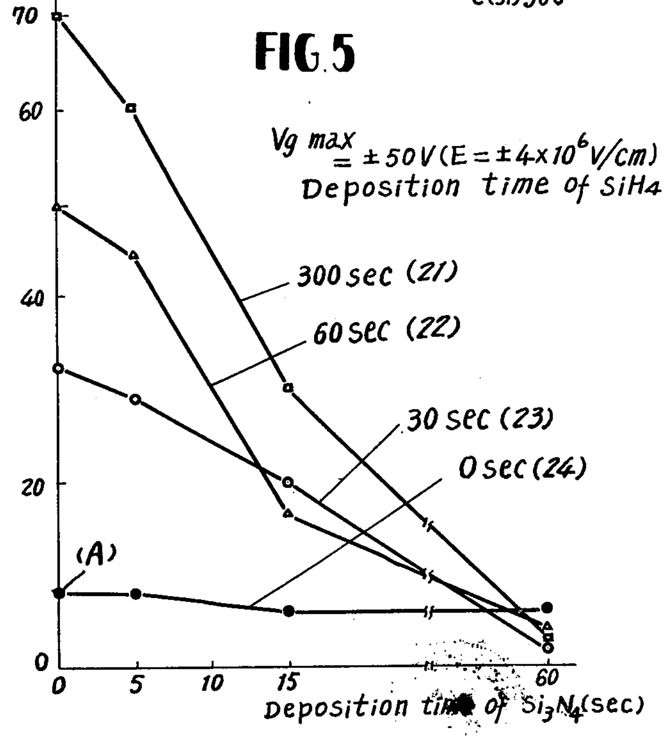

FIG. 5 shows the result of an experiment keeping the gate voltage constant ($Vg$ max = ±50V, $E = \pm 4 \times 10^6$ V/cm) while changing $\Delta V_{FB}$ and both deposition times for the clusters or thin-film 3 and insulated coating 4. When silicon nitride is used for insulated coating 4, the surface of the silicon substrate to be located under the silicon nitride coating will react with the oxygen in the air and produce a silicon oxide coating of thickness 5 to 20 angstroms at the normal temperature. This oxide coating will be removed in ammonia gas at above 1,000°C in more than 10 minutes and the part of the oxide coating will be changed into silicon nitride. The oxide coating will, on the other hand, be removed with the special cleaning process of the silicon substrate. If pure MNS structure is required, the above treatment has to be used. The oxide thin-film produced at the normal temperature can be neglected in practice. The so-called natural oxide, such as in the above case, is random in its thickness at the surface of the substrate.

For example, the thickness of one part will be in the region of 20 angstroms, and the thickness of the other part in the same substrate will be zero angstroms.

In the figure, the silicon nitride coating shows a growing speed of 1 to 2 angstroms per second. The above random thickness should be taken into the consideration at zero seconds at the $y$ axis. The point A in the figure represents a MNS diode. The corresponding value of $V_{FB}$ is 8V with $\pm 4 \times 10^6$ V/cm. In this way, hysteresis is very low when the cluster of the thin-film has not been formed by silane depositing. When the coating 4 in the FIG. 2 comprises high temperature oxide coating, hysteresis ($\Delta V_{FB}$) for the same thickness was less than one volt under the same field potential.

In the case when silane is deposited to form the cluster or the thin-film, as the deposition time increases (as shown in the figure), the curve changes 24, 23, 22, and 21, $\Delta V_{FB}$ increases and the thickness of the silicon nitride coating 4 in FIGS. 2(A) and 2(B) increases, $\Delta V_{FB}$ decreases.

When the deposited time of silicon was 30 sec. and 60 sec., silicon clusters were formed. The diameters of the silicon clusters were between 300 angstroms and 1,500 angstroms under the electron microscopic measurements. On the other hand, silicon thin-film was produced when the deposited time was more than 300 sec. When the deposited film thickness is more than 500 angstroms, it should be called a thick-film. In the present invention, when the average film thickness of semiconductor is below 100 angstroms, clusters are produced. When it is between 100 angstroms and 500 angstroms, a thin-film of semiconductor is produced. When the semiconductor thick-film is produced in the insulator coating, it is rather called floating silicon gats of MISFET. In the experiments conducted in connection with the present invention, when the thick-film was produced, the insulated coating 4 in FIG. 2(B) had to have more than 500 angstroms in order not to produce pin-holes or other conductive paths. During the formation of the clusters or thin-film C, the introduction of ammonia or hydrazine of the same volume as the silane gas or with less volume than that of the silane gas may help the cluster formation to be accelerated.

When a small quantitty of nitride gas is introduced, it becomes hard to produce a thin-film of silicon semiconductor. The silicon clusters are formed when the deposition time is around 300 sec. or more under the same flow rate of silane as the conditions of preparation of silicon cluster in FIG. 5.

Accordingly, it is possible to get a long memory retention due to holes or electron capture at the clusters, even when there are a few pin-holes or conductive paths present at the coating 4 between the clusters and the substrate or gate electrode. On the contrary, when there are pin-holes at the coating 4 in the thin-film of semiconductor, the captured electrons or holes at the thin-film leak to the substrate 5. Accordingly, the memory retention as a semiconductor memory is not as effective.

As a result, it was experimentally established that the memory retention of longer than 2,000 hours is possible when the cluster of silicon or germanium was used. It was less than 500 hours, for instance, 1 hour, when the thin-film of semiconductor was used. The result obtained will be the same when the ammonia gas is not used.

The above experimental data shows that the teaching of the present invention is well-founded. The hysteresis phenomena to be found in the C-V characteristics of the MNS structure and MNOS structure does not result from the so-called irregularity of atomic size but is caused by the clusters existing in the insulator coating and acting as trap centers for electrons and holes, when it is desired to control the size and shape of the hysteresis in the C-V characteristics.

The present invention provides a novel structure of the cluster or the thin-film to act as a trap center distributing these uniformly and at a constant distance from the substrate.

Embodiment 2

The embodiment 2 refers to the FIGS. 2(D) and 2(E) having a $MNCl_1l_2S$ structure ($l_1$ and $l_2$ represent the insulated coating 4 and 11 respectively).

The material and the process for the semiconductor substrate, the insulated coating, the cluster or the thin-film and the gate conductor are the same as in the embodiment 1. The structure in the FIGS. 2(C) and 2(D) features the formation of silicon oxide coating locally in the surfaces thereof at the normal temperature. This kind of oxide coating undergoes a reaction when the heat treatment for the semiconductor cluster or the thin-film is done at above 500°C. in one hour, as described in the foregoing. For this reason, the provision around the semiconductor cluster or the thin-film of a coating of silicon nitride or germanium nitride is most desirable.

The present invention overcomes these difficulties by changing the MNCOS structure or the MNCNS structure shown in the embodiment 1 into a MNCNOS structure. FIG. 2(L) shows a MINCNOS or MICONS structure, an improved version of the MNCONS, putting tantalum oxide or titanium oxide insulating coating having larger specific dielectric constant on the nitride coating (2) formed on the MNCONS structure, that is, on the cluster or the thin-film. The MINCNOS structure has a thin electrical coating and a thick physical coating, thereby protecting the gate portion of the semiconductor device from any mechanical shocks being applied thereto. In addition to this, the cluster or the thin-film may be multi-layered to augment its effect. This structure is a modification of the described embodiment of the present invention.

After tendering the surface of the silicon semiconductor having the impurity density of $No = 1 \times 10^{15} cm^{-3}$(100) to be completely clean, silicon oxide coating (7) was produced by solid-vapor reaction in dry oxygen for 100 seconds at 1,000°C. Then, a silicon nitride coating was formed by CVD using silane and ammonia for 15 seconds. $SiH_2Cl_2$ and $SiCl_4$ were tested in the experiment and the results were the same. The cluster or the thin-film was produced by silane depositing processing in 300 seconds. Again, a silicon nitride coating of 1,200 angstroms thickness was formed on the cluster or the thin-film, while keeping the temperature of the substrate at 650° to 750°C. Finally, a MNCNOS structure was completed forming an aluminum electrode on the above, using vacuum evaporation processing.

$\Delta V_{FB}$ decreases in proportion to the increased thickness of oxide coating 7 added to nitride coating 4. $\Delta V_{FB}$ increases in proportion to the deposition time of silane. These are the same as those shown in FIG. 5.

Figure 6:
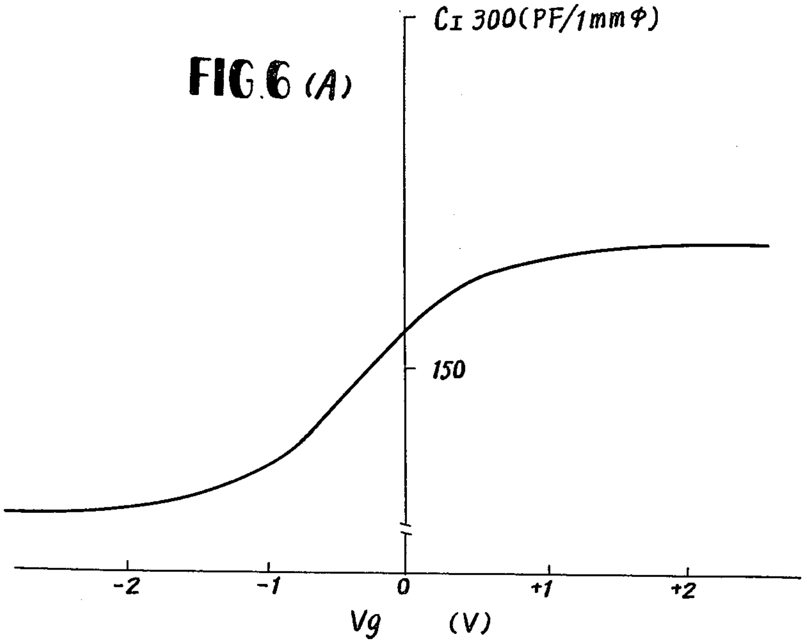
FIG. 6 shows the data derived from the experiment in a MNCNOS structure.
Figure 6:
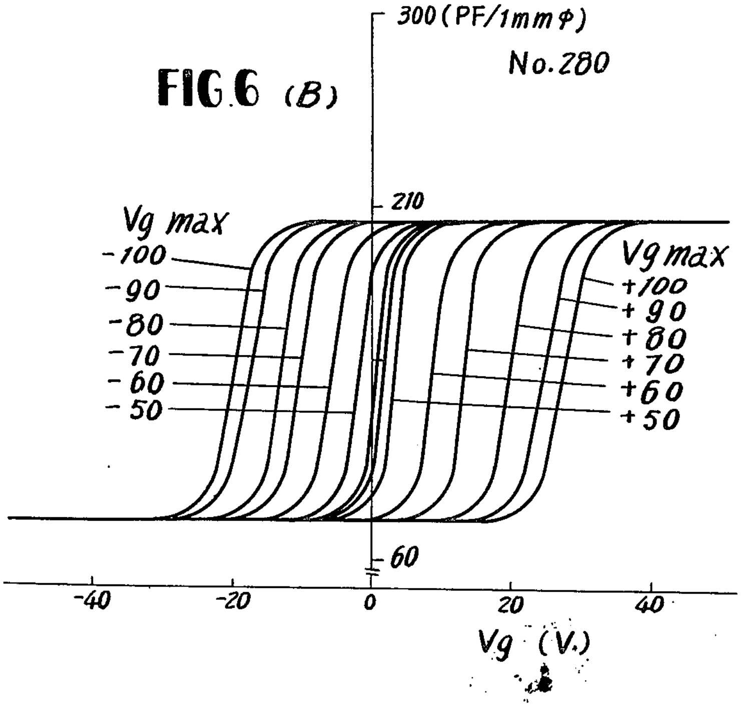

The FIGS. 6(A) and 6(B) show the C-V characteristic obtained in the experiment. $\Delta V_{FB}$ increases in proportion to $V_g$ max (for maximum applied gate voltlage in volts). The figure shows no hysteresis characteristic when *Vg* max is less than 50V. The critical voltage of the sample in FIG. 6 is 50V, and the hysteresis, $\Delta V_{FB}$, increases with the increment of the maximum gate voltage, *Vg* max. The C-V characteristic without hysteresis is shown in FIG. 6(A). This figure shows that the interface properties between the substrate 5 and insulator 11, 4 will be an ideal characteristic for a MISFET gate.

Because of the fast states and the fixed charge, *Qss/q* existing on the interface is almost zero. Therefore, the fabrication of the present inventive structure requires the technique for the fabrication of cluster-free or cluster-less silicon nitride or cluster-free or cluster-less germanium nitride coating.

The present embodiment shows that it is possible to control the degree of hysteresis in C-V characteristics by changing the preparation condition such as the deposition rate of silicide gas, deposition time of silicide gas, the ratio of the small amount of ammonia or hydrazine and the distance between the cluster or thin-film and the interface. It is also possible to control the degree of hysteresis by changing the deposition temperature of silicide gas above 750°C or below 650°C.

The energy band in the embodiment is shown in FIG. 3(B) with markings corresponding to the FIGS. 2(C) and 2(D).

Embodiment 3

This embodiment describes the characteristic of MISFET consisting of the structure shown in FIGS. 2(A) and 2(B) with gate. The embodiment uses N channel and its basic structure is shown in FIG. 1, the distance of the source 14 and drain 16, socalled channel length, is 30 microns and each gate has 1,000 microns *aof* length.

Figure 7:
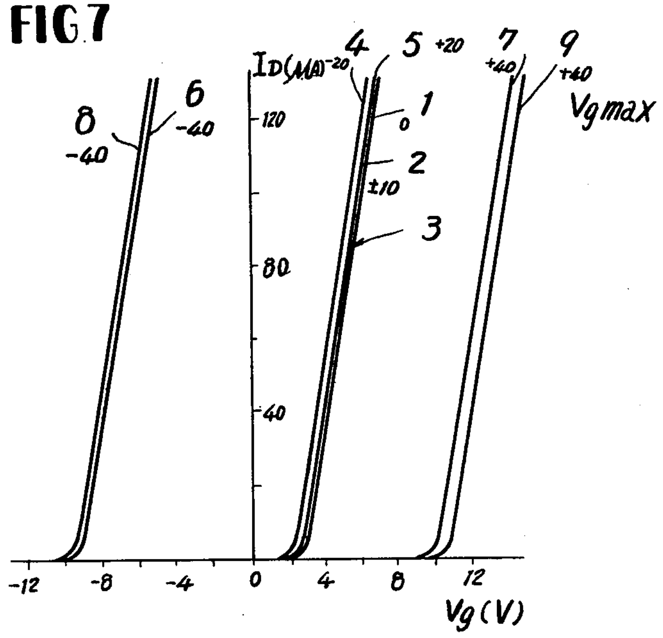
FIGS. 7, 8 and 9 show characteristics of a MISFET susing the structure in the FIGS. 2(A) and 2(B) as the gate.
Figure 8:
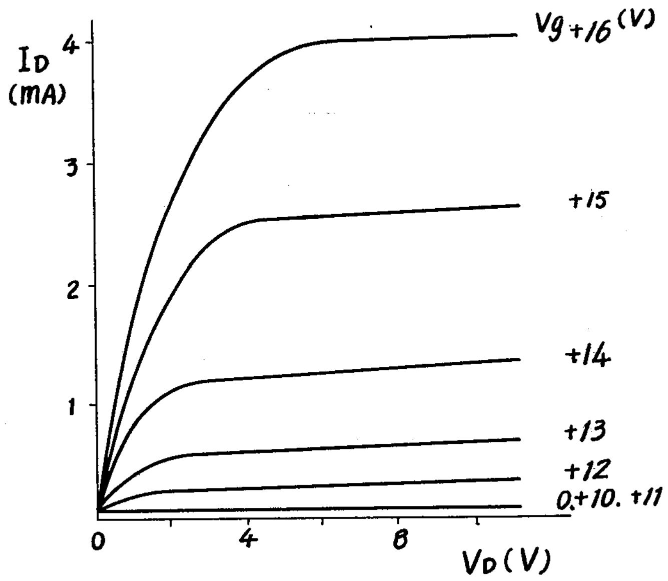
Figure 9:
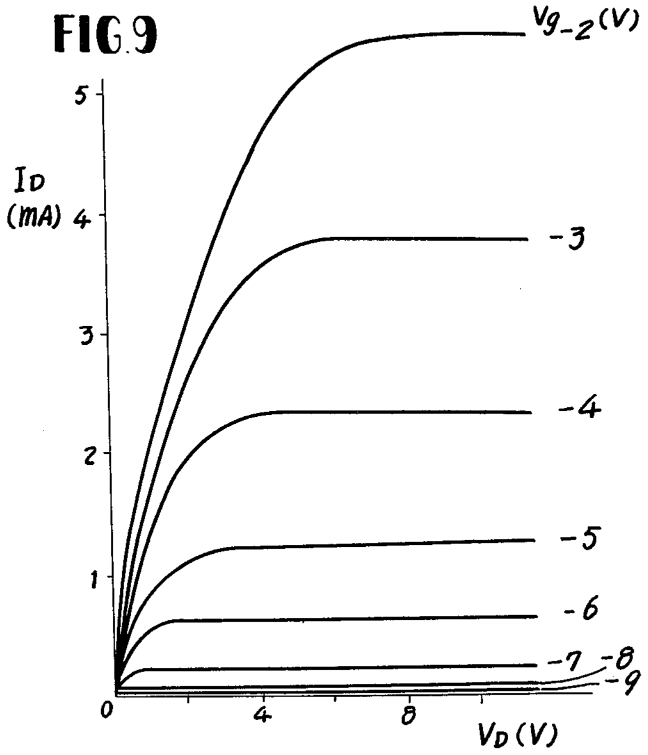

The substrate is of P type (100) and its specific resistance is 3 to 5Ωcm. The FIGS. 7, 8, and 9 show the result from the above experiment. The gate insulator corresponding to the silicon nitride coating 2 in FIG. 2 is in the range of thickness of 600 to 700 angstroms. This value is about half of those in embodiments 1 and 2. The thickness of the coating may be changed depending on the application. When the P channel MISFET is desired, the conductivity of the substrate should be changed into the N type, and $P^+$ type source and drain should be provided with it.

In FIG. 7, the x axis represents gate voltage (V*g*) and the *y* axis represents drain current (I*d*). The drain voltage was skept at 100 mv constant. The V*g* – I*d* characteristics remain the same while the threshold voltage (V*th*) changes between plus 10v to minus 10v. The slope of the characteristic shows that the carrier mobility in the channel is $400^{cm^2}/V \cdot sec$.

The fact observed in the above experiment contradicts the concept hitherto known in semiconductor engineering, that is, as the surface state at the interface is high, the carrier mobility in the channel is low, and as the surface states become lower, the carrier mobility at the interface is nearer the bulk carrier mobility.

With a small increase or decrease of the gate voltage at the initial V*th* of +2V, the data of the V*g* – I*d* characteristic remains the same with gate voltage less than the critical voltage (V*c*). With gate voltage above the critical voltage, the data shifts toward the direction of the applied voltage. The critical voltage of the present embodiment was ± 23–25V.

The characters ① through ⑨ shown in the figure indicate the sequence of the maximum applied gate voltage (Vg max). At Vg – OV with flowing I*d*, characteristics ⑤ and ⑧ are obtained. This represents the "ON" state. AT V*g* – OV with no I*d*, characteristics ⑦ and ⑨ are obtained. That is, the "OFF" state. It can be seen from the characteristic that it is feasible to change ON into OFF and OFF into ON repeatedly, and thus the present invention functions as a random access memory device (RAM).

The figure 8 shows drain voltage (V*d*) vs. drain current (I*d*) characteristic corresponding to the FIG. 7, character ⑨ representing the maximum gate voltage at +40V. The characteristic shows that I*d* > at Vg>10V and T*d* = 0 at V*g* < 10V. The latter represents an OFF state.

The FIG. 9 shows V*d* – I*d* characteristic corresponding to the FIG. 7 and character ⑧ with maximum gate voltage at −40V. It shows that I*d* > 0 at V*g* = 0 at V*g* < −10V. The former represents an ON state.

As described in the above, by disposing a mono-layer or multiple of layers of the semiconductor cluster or the thin-film in the insulated coating and thereby providing the said insulator coating with MISFET as an insulated coating for the gate, both ON and OFF states are obtained at V*g* = OV or at V*g* ÷ OV while applying variable V*th* (using V*g* – OV as an axis of those symmetrical V*th*), for example, in the voltage range +10V to −10V.

A non-volatile memory can be obtained using the above techniques. Also, changing V*th* in positive or negative direction to some extent from OV enables the MISFET to change its dynamic characteristic. With this and symmetrical characteristics centered in V*g* = OV obtained from both the C-V characteristics in the FIG. 6 6(B) and the V*g* – I*d* characteristic in the FIG. 7, it is seen that a boundary charge (mostly positive charge) known to occur in the art and the charge trapped by the cluster differ from each other in relation to the place where they are to be trapped.

Embodiment 4

The embodiment describes the structure illustrated in FIGS. 2(E) and 2(F) with insulated coating. In the FIGS. 2(A) and 2(B), the clusters and the thin-film exist on the substrate side; however, in the instant embodiment, they exist on the electrode side. As the material for the electrode, aluminum or gold is used, in general. In this case, only electron exists as a carrier and the resulting device will be ready-only memory, and thus it is not completely flexible as memory device, particularly because a hole cannot be put into the device to cancel the electron to be trapped.

For this reason, either of three kinds of inpurities, that is, P type or N type or both types, and highly doped silicon or germanium (in the order of $10^{19}$–$10^{20}cm^{-3}$) are used in the experiment. In the case of silicon gate, diborane or phosphine is deposited with silane as a P type or N type impurity respectively. These make the $V_{FB}$ to shift either in the right or the left direction in proportion to the difference of the work function between the substrate and the electrode and, at the same time, there shall be obtained many holes. Otherwise, the holes hardly exist.

To make the coating 2, only the CVD process is applicable, unlike for the coating 4. AS the coating 2, silicon nitride in the thickness range of 10 to 100 angstroms is formed. It helps to prevent the pollution from the outside.

Figure 10:
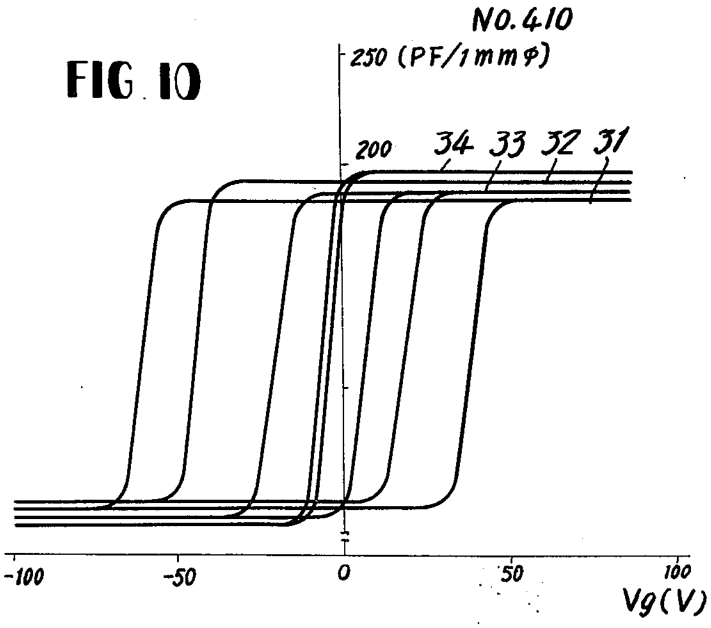
FIG. 10 shows the C-V characteristic for a NNCNS diode having the structure in the FIGS. 2(E) and 2(F).
Figure 11:
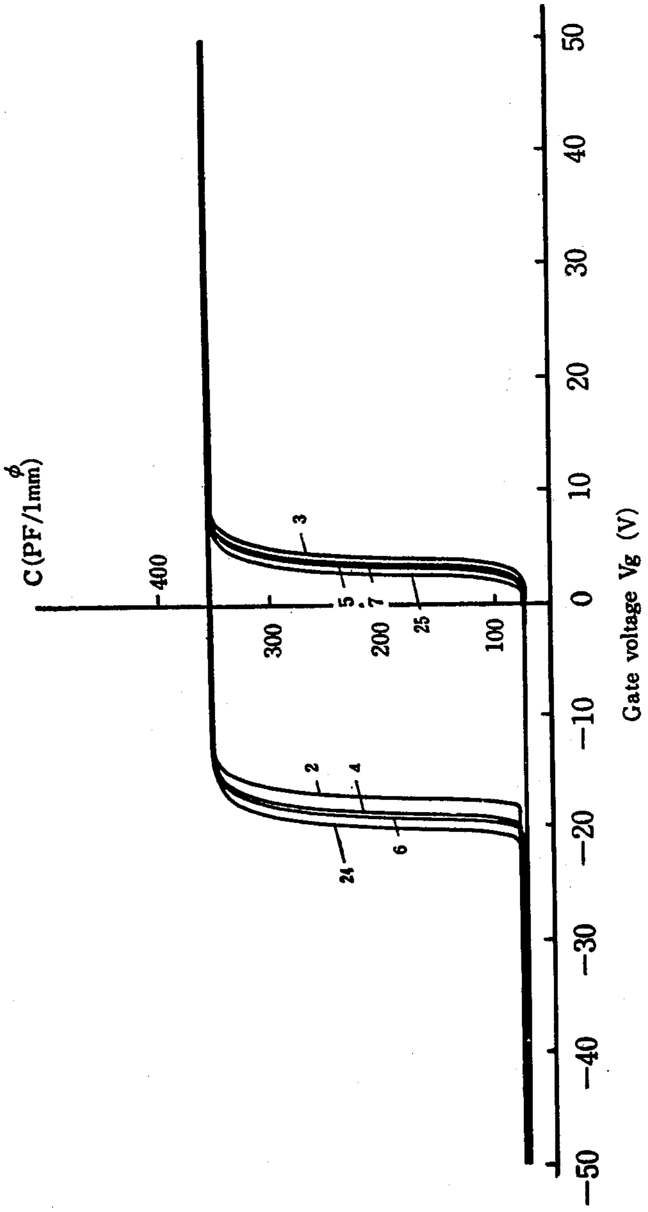
FIG. 11 shows Cg-Vg characteristics for an MNCOS structure when rewriting has repeatedly taken place at $Vg = \pm 50$V.
Figure 12:
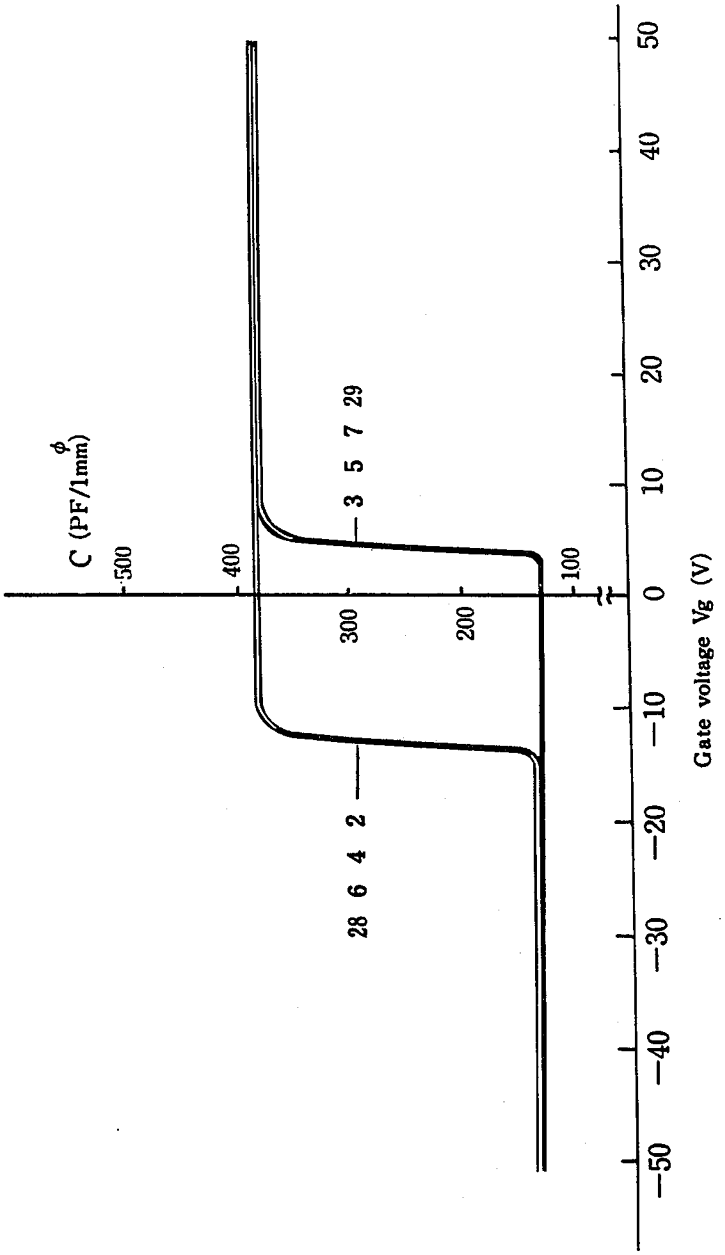
FIG. 12 shows C-*Vg* characteristics of an MNCNOS structure subjected to repeated (e.g. 28 times) electrical rewriting at positive and negative gate voltages using the embodiments shown in FIG. 2.

The results of the experiment were all in agreement and uniform. The FIG. 10 is obtained to change the thickness of the (2) in FIGS. 2(E) and 2(F).

The characteristic resembles the characteristic obtained in FIGS. 2(A) and 2(B) with increased thickness of the (4) in the shape. The characters 31, 32, 33 and 34 represent thicknesses of 15 angstroms, 25 angstroms, 50 angstroms and 200 angstroms, respectively.

The data at $Vg = \pm \pm 100V$ was 120V for $\Delta V_{FB}$. To increase the charge to be injected, the distance to a source of the injection, that is, the distance between semiconductor gate 1 and the cluster or the thin-film 7 should be shortened. This resembles the data in the embodiment 1and the FIG. 5 as far as the general trend is concerned. The experiments proved that a cluster such as 7 in FIG. 2(E) would yield a high production rate. In the case of the semiconductor thin-film such as 7 in the FIG. 2(F), pin holes existing in the insulated coating 2 shall leak the trapped charge.

Then, it was found that to use the FIG. (F) In practice, the average thickness of the coating 2 should be above 50 angstroms. As described in the embodiment 1, it is desirable to mix a small amount of nitride gas such as ammonia to silicide gas in order to get the long memory retention when the semiconductor cluster is produced.

The figures 2(G), 2(H), 2(I) and 2(J) represent the combination of (A) and (E), (B) and (F), (B) and (E) and (F) and (A), respectively, to double each function.

The present invention provides the semiconductor cluster or thin-film coating with the insulated coating on at least part of the surface of the semiconductor while keeping a constant distance between them.

The present invention provides the means to control the degree of the hysteresis in the C-V characteristic by changing the condition of preparation of the formed cluster or thin-film and the distance between the clusters and the interface. The present inventive structure is based on the novel theory developed by the applicant, and thus the invention differs significantly from the conventional MNOS structure using trap centers which may be formed accidentally owing merely to variations in processing.

The present invention is an innovation in the use of semiconductor devices, particularly the MISFET.

In the foregoing discussion, the layer of clusters for the thin-film has been used because electron micrographs revealed existence of the cluster only, the thin-film only and a mixture of them both.

Figure 13A:
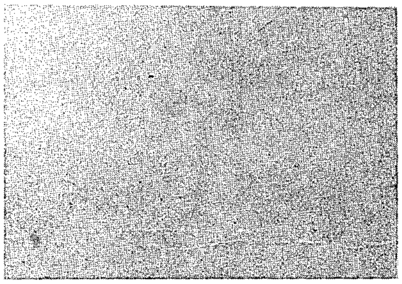
FIGS. 13*a*, 13*b* and 13*c* illustrate the cluster formation of the present invention as viewed under an electron microscope.
Figure 13B:
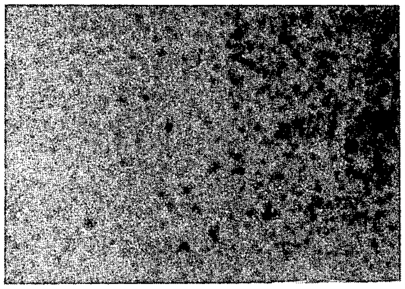
Figure 13C:
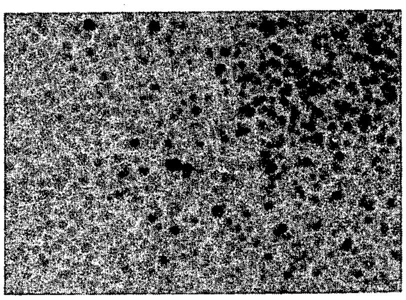

FIG. 13 illustrates the meaning of the term clusters and their formation as used in the instant invention. FIG. 13A shows a silicon nitride film magnified 30,000 times in a transmission electron microscope, the film not containing clusters. FIG. 13B shows cluster formation, the clusters having an average thickness of 40A while FIG. 13C shows a cluster formation wherein the clusters have an average thickness of 120A.

The present inventive structure facilitates both the fabrication and changing parameters.

The size, density, and thickness of the cluster can be changed so easily that the device can be used in many ways such as non-volatile memory, variable $V_{th}$ MISFET, etc.

What is claimed is:

1. A metal-insulator-silicon field effect transistor having an MNCNOS gate structure displaying semiconductor memory characteristics, said MACNOS gate structure comprising:
- a semi-conductor substrate having a surface;
- at least one first nitride insulating layer disposed on said surface;
- at least one semiconductor layer comprising a plurality of clusters of a semiconductor material disposed over said first nitride insulating layer;
- at least one second nitride insulating thin-film disposed over said at least one semiconductor layer, said at least one semiconductor layer forming a trap center means for trapping charge carriers such as electrons and holes transmitted thereto during operation of said transistor.

2. A device as defined in claim 1 wherein said trap center means is disposed at a predetermined distance from said surface of said semiconductor surface, said clusters of said trap center means being distributed in a direction transverse of the thickness of said first and second nitride insulating coatings.

3. A device as defined in claim 1 wherein said clusters have the shape of compressed hemispheres the diameters and thicknesses of which are within the range 10A to 3000A and 5A to 300A respectively.

4. A device as claimed in claim 3 wherein an average diameter of said clusters is less than 100A.

5. A device as claimed in claim 1 wherein said trap center means has an energy band configuration which is the same as said substrate.

6. A device as claimed in claim 1 wherein said semiconductor layer is a single layer, said semiconductor material comprising said semiconductor layer being chosen from the group consisting of silicon and germanium.

7. A device as claimed in claim 6 wherein the thickness of said single layer is within the range 100A to 500A.

8. A device as claimed in claim 1 wherein said nitride thin-film is selected from the group consisting of silicon nitride and germanium nitride.

9. A transistor as claimed in claim 1 wherein said gate structure comprises successive layers of:
- silicon oxide disposed on said semiconductor substrate;
- silicon nitride disposed on said silicon oxide;
- a plurality of clusters of silicon disposed on said silicon nitride;
- silicon nitride disposed on said clusters, said clusters being formed at a predetermined distance from said semiconductor substrate and acting as trap centers for charge carriers such as electrons and holes transmitted thereto during operation of said transistor.

* * * * *